(12) United States Patent
Sun et al.

(10) Patent No.: US 10,154,612 B1
(45) Date of Patent: Dec. 11, 2018

(54) ELECTRONIC DEVICE HAVING ACTIVE HEAT DISSIPATION

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Yu-Min Sun, Hsinchu (TW); Chih-Feng Cheng, Hsinchu (TW); Chih-Chieh Liao, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/968,739

(22) Filed: May 1, 2018

(30) Foreign Application Priority Data

Jan. 12, 2018 (CN) .......................... 2018 1 0029225

(51) Int. Cl.
 *H05K 7/20* (2006.01)
(52) U.S. Cl.
 CPC ................. *H05K 7/20163* (2013.01)
(58) Field of Classification Search
 CPC ............ H05K 7/20154; H05K 7/20163; H01L 23/467
 See application file for complete search history.

(56) References Cited

U.S. PATENT DOCUMENTS

| | | | | |
|---|---|---|---|---|
| 5,740,013 A | * | 4/1998 | Roesner | H01L 23/467 174/383 |
| 5,768,104 A | * | 6/1998 | Salmonson | H05K 7/20454 257/714 |
| 5,921,087 A | * | 7/1999 | Bhatia | F25B 21/02 136/203 |
| 6,459,581 B1 | * | 10/2002 | Newton | H01L 23/34 165/80.3 |
| 7,806,168 B2 | * | 10/2010 | Upadhya | F04B 17/00 165/104.33 |
| 8,157,001 B2 | * | 4/2012 | Hom | G06F 1/20 165/165 |
| 8,464,781 B2 | * | 6/2013 | Kenny | F04B 17/00 165/104.33 |
| 8,602,092 B2 | * | 12/2013 | Lenehan | H01L 23/34 165/247 |
| 2003/0173942 A1 | | 9/2003 | Kenny, Jr. et al. | |

* cited by examiner

*Primary Examiner* — Adrian S Wilson
(74) *Attorney, Agent, or Firm* — CKC & Partners Co., Ltd.

(57) ABSTRACT

An electronic device having active heat dissipation includes a wiring board, a semiconductor package unit, a surrounding unit, a fan module and a tube member. The semiconductor package unit is soldered to the wiring board through three-dimensional contacts. The surrounding unit is connected to the wiring board and the semiconductor package unit, and surrounds the three-dimensional contacts, such that a heat exchange space is collectively defined by the surrounding unit, the wiring board and the semiconductor package unit. The surrounding unit is provided with two openings which are in communication with the heat exchange space. The fan module is located outside the heat exchange space, and is connected to one of the openings.

10 Claims, 5 Drawing Sheets

ELECTRONIC DEVICE HAVING ACTIVE HEAT DISSIPATION

RELATED APPLICATIONS

This application claims priority to China Application Serial Number 201810029225.8, filed Jan. 12, 2018, which is herein incorporated by reference.

BACKGROUND

Field of Disclosure

The present disclosure relates to an electronic device. More particularly, the present disclosure relates to an electronic device having active heat dissipation.

Description of Related Art

With constant progress of semiconductor manufacture processes, the performance of a semiconductor package unit is increasingly improved, and more heat is generated while the semiconductor package unit is in a computation operation. Thus, the heat dissipation of the semiconductor package unit becomes more important.

In general, a manufacturer often arranges heat-dissipating fins contacting a top surface of a semiconductor package unit, and blows cool air towards the heat-dissipating fins, so as to carry the heat away from the semiconductor package unit, thus improving the excessive heat problem of the semiconductor package unit.

However, besides the aforementioned heat-dissipating method, more heat dissipation methods are needed for ensuring the semiconductor package unit to operate continuously and stably.

SUMMARY

According to one embodiment, an electronic device having active heat dissipation includes a wiring board, a semiconductor package unit, a surrounding unit, at least one fan module and at least one tube member. The semiconductor package unit includes three-dimensional contacts. The semiconductor package unit is soldered to a surface of the wiring board through the three-dimensional contacts. The surrounding unit is connected to the semiconductor package unit and the wiring board, and surrounds the three-dimensional contacts, such that a heat exchange space is collectively defined by the surrounding unit, the surface of the wiring board and the semiconductor package unit. The surrounding unit includes a first opening and a second opening. The fan module is located outside the heat exchange space. The tube member is connected to the first opening and the fan module so as to allow the fan module to cool the three-dimensional contacts.

Thus, in the above embodiment, the three-dimensional contacts (e.g., solder balls) of the semiconductor package unit can be effectively cooled down, thereby reducing the possibilities of the wiring board getting warpage, lowering aging speed and failure rate of the wiring board and its components mounted thereon, decreasing the wire resistance of the wiring board, and improving the wire quality of the wiring board.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

DESCRIPTION OF THE EMBODIMENTS

Figure 1:
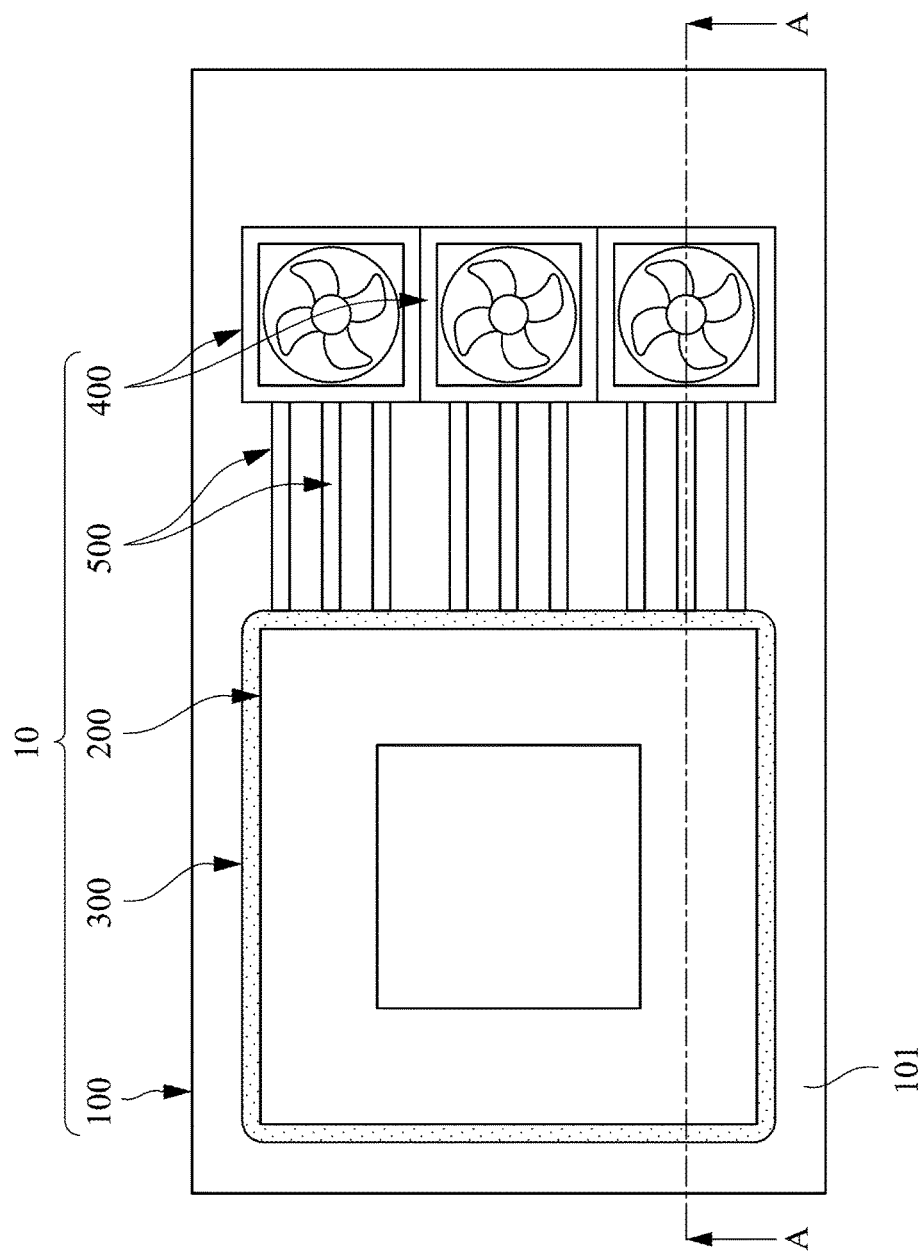
FIG. 1 is a schematic top view of an electronic device according to one embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the disclosure.

In view of the foregoing, the conventional semiconductor package unit needs an effective heat dissipation scheme for continuous and stable operation. Because a semiconductor package unit is soldered on a wiring board through solder balls, inventors of the disclosure have found through experiments that a high portion of heat (e.g., 98.5%) generated by a bare die of the semiconductor package unit during operation is conducted to the wiring board via all of the solder balls. The total areas of all of the solder balls of the semiconductor package unit exposed to the atmosphere are much greater than the total area of the bare die of the semiconductor package unit exposed to the atmosphere. For example, the ratio of the total exposed areas of all of the solder balls to the total exposed area of the bare die is 4.84:1. Thus, this disclosure proposes another heat dissipation scheme for dissipating heat transferred to the solder balls from the bare die, thereby reducing the possibilities of the wiring board getting warpage, reducing aging speed and failure rate of the wiring board and its components mounted thereon, and reducing the wire resistance of the wiring board, and improving the wire quality of the wiring board.

Figure 2:
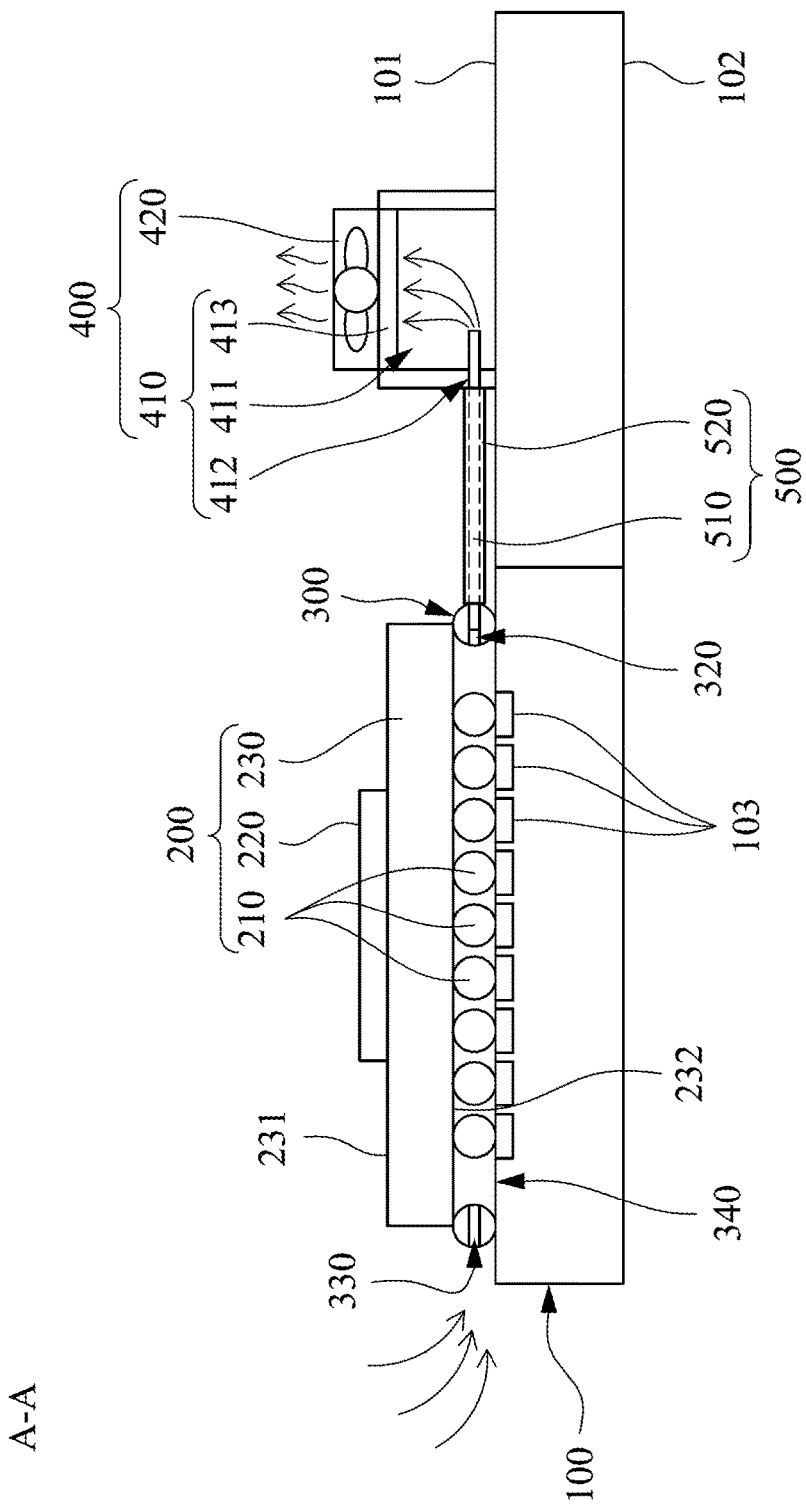
FIG. 2 is a cross sectional view of FIG. 1 viewed along a line 2-2.
Figure 3:
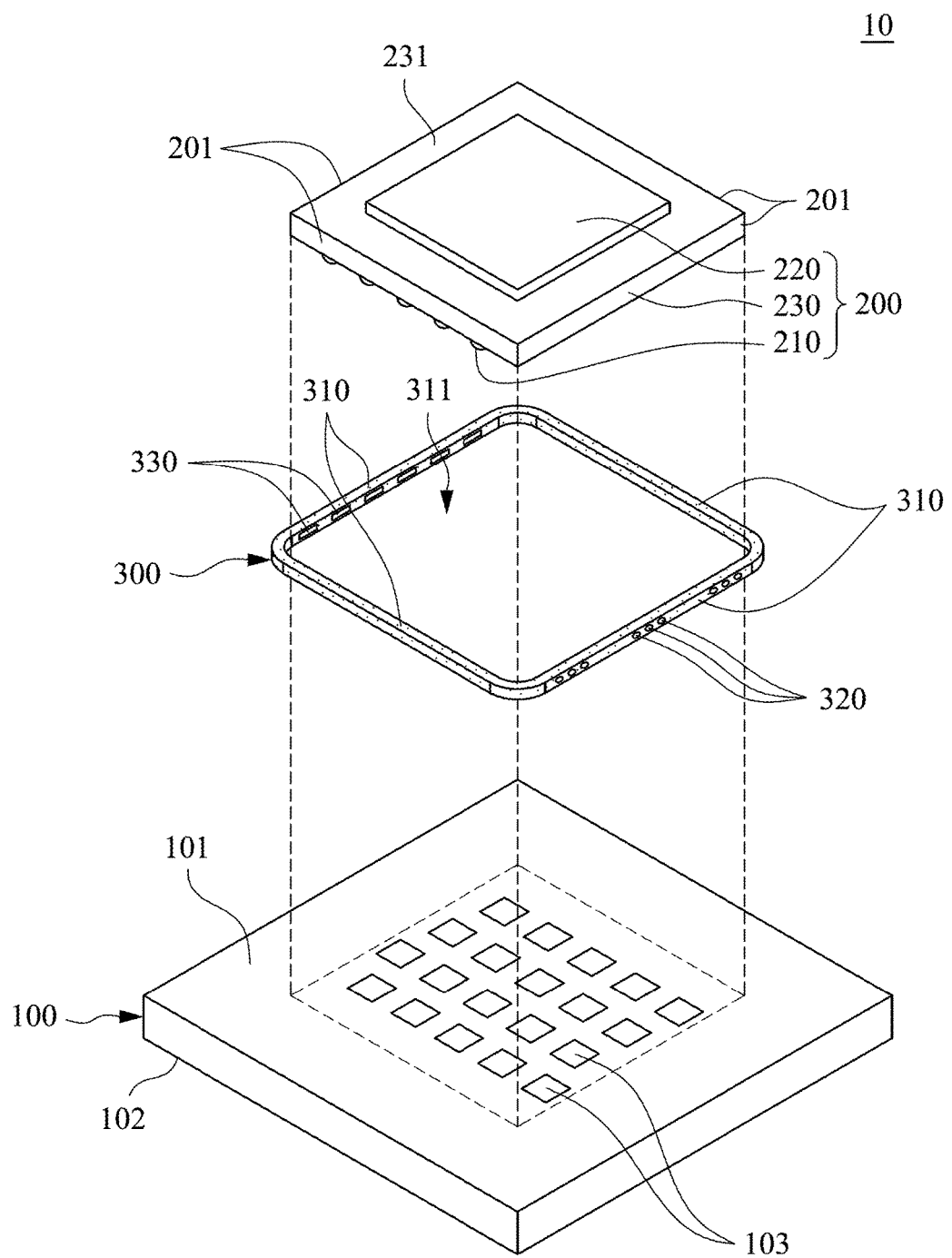
FIG. 3 is a partially exploded view of FIG. 1.

Reference is now made to FIG. 1 to FIG. 2 in which FIG. 1 is a schematic top view of an electronic device 10 according to one embodiment of the disclosure, and FIG. 2 is a cross sectional view of FIG. 1 viewed along a line 2-2. The electronic device 10 having active heat dissipation includes a wiring board 100, a semiconductor package unit 200, a surrounding unit 300, one or more (e.g., three) fan modules 400 and one or more (e.g., nine) tube members 500. The wiring board 100 includes a top surface 101 and a bottom surface 102. The wiring board 100 is provided with soldering pads 103 at the top surface 101. The semiconductor package unit 200 is soldered on the top surface 101 of the wiring board 100. The semiconductor package unit 200 includes a capsulation body (not shown in the figures), at least one bare die 220, a substrate 230 and plural three-dimensional contacts 210 (e.g., a ball grid array, BGA or soldering points). The substrate 230 is disposed between the bare die 220 and the three-dimensional contacts 210, i.e., the bare die 220 is fixed on a top surface 231 of the substrate 230, and the three-dimensional contacts 210 are arranged and spaced from each other on a bottom surface 232 of the substrate 230. With the three-dimensional contacts 210 electrically contacting the soldering pads 103 in a one-to-one manner, the semiconductor package unit 200 is soldered on the top surface 101 of the wiring board 100. The capsulation body covers the bare die 220 and the top surface 231 of the substrate 230. In the embodiment, as shown in FIG. 2 and FIG. 3, the surrounding unit 300 is in a circular ring shape or a square ring shape to define an inner space 311 therein. The surrounding unit 300 is located between the semiconductor package unit 200 and the wiring board 100 to surround all of the three-dimensional contacts 210, such that a heat exchange space 340 is collectively defined by the surrounding unit 300, the bottom surface 232 of the substrate 230, and the top surface 101 of the wiring board 100, and the heat exchange space 340 is defined among the three-dimensional contacts 210.

Figure 4B:
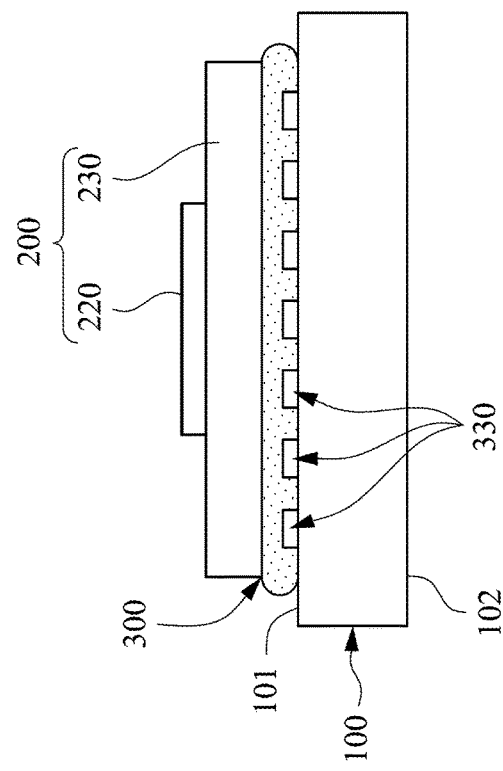
FIG. 4A and FIG. 4B are schematic side views of two opposite sides of the surrounding unit of FIG. 1.
Figure 4A:
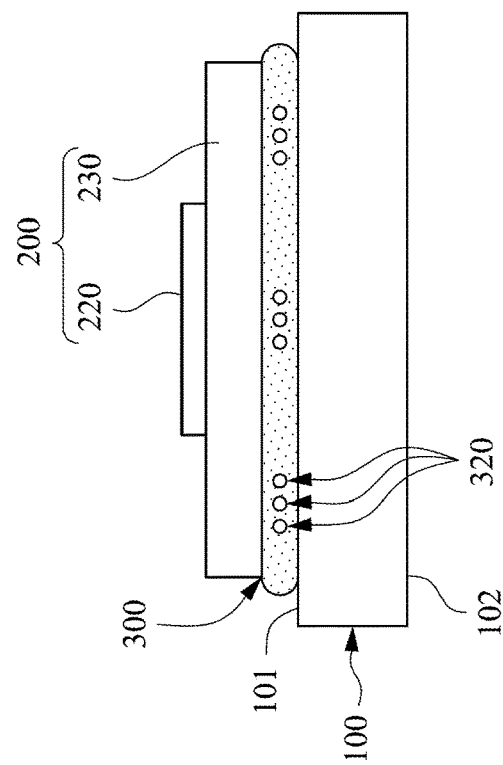

Furthermore, FIG. 4A and FIG. 4B are side views of two opposite sides of the surrounding unit 300 of FIG. 1. As shown in FIG. 2, FIG. 4A and FIG. 4B, the surrounding unit 300 includes one or more first openings 320 and one or more second openings 330. The first openings 320 are arranged and spaced from each other in a single row, and the second openings 330 are arranged and spaced from each other in a single row. The first openings 320 and the second openings 330 are in communication with the heat exchange space 340, respectively. Each of the tube members 500 is connected to one of the fan modules 400 and one of the first openings 320. The fan modules 400 are located outside the heat exchange space 340, and are used to inject air flows into the heat exchange space 340 by using the tube members 500, thereby dissipating heat of all of the three-dimensional contacts 210 in the heat exchange space 340.

For example, as shown in FIG. 2, when being in operation, each of the fan modules 400 draws air flows from the heat exchange space 340 through one of the tube members 500, such that each of the second openings 330 act as air inlets, and each of the first openings 320 act as air outlets. However, the disclosure is not limited thereto. In other embodiments, the fan module 400 also can inject air flows into the heat exchange space 340 through the tube member 500, such that the first openings 320 act as air inlets, and the second openings 330 act as air outlets.

Further, each of the fan modules 400 includes an air chamber 410 and a fan unit 420. The air chamber 410 includes a buffering space 411, one or more (e.g., three) opening holes 412 and one or more (e.g., three) fan engagement interfaces 413. The buffering space 411 is located in the air chamber 410, and the opening holes 412 and the fan engagement interfaces 413 are formed on the surfaces of the air chamber 410, and the buffering space 411 is in communication with the opening holes 412 and the fan engagement interfaces 413. Each of the tube members 500 is connected to one of the opening holes 412. Each of the fan units 420 is connected to one of the fan engagement interfaces 413 for injecting air flows into the heat exchange space 340, the air chamber 410 and the tube members 500. Thus, when each of the fan units 420 is in operation, hot air within the heat exchange space 340 can be discharged through the respective tube members 500 and the air chamber 410, so as to cool down the three-dimensional contacts 210 of the semiconductor package unit 200.

For example, the air chamber 410 of the fan modules 400 is disposed on the top surface 101 of the wiring board 100, and each of the fan units 420 is disposed on one surface of the air chamber 410 opposite to the wiring board 100. Thus, hot air within the heat exchange space 340 will not be directed towards other components on the wiring board 100, such that the possibilities of the component failure caused by high temperature would not be increased. However, the air chamber 410 is not a necessary or essential element in the disclosure, and the locations and the exhaust directions of the fan units 420 are not limited in the disclosure.

Also, each of the tube members 500 includes a hard tube 510 and a soft hose 520. One end of the hard tube 510 is connected to each of the first openings 320, and the other end of the hard tube 510 is connected to each of the opening holes 412. Thus, each of the fan modules 400 can communicate with the heat exchange space 340 through the respective hard tubes 510. A hardness of the hard tube 510 is greater than a hardness of the soft hose 520. Each of the hard tubes 510 is disposed in and protected by one of the soft hoses 520. However, as long as the fan modules 400 and the heat exchange space 340 are in communication with each other, and a specific negative pressure can be continually provided by the fan modules 400, the disclosure is not limited to types and appearance of the tube members 500.

In addition, as shown in FIG. 3, in the embodiment, the surrounding unit 300 is an elastic strip ring which is made of rubber or silicone. The elastic strip ring can be hermetically connect to the semiconductor package unit 200 and the wiring board 100, and tightly surround all of the three-dimensional contacts 210 located between the semiconductor package unit 200 and the wiring board 100. The elastic strip ring is electrically isolated from all of the three-dimensional contacts 210. Therefore, after the semiconductor package unit 200 is soldered to the wiring board 100, a user may quickly and easily place the elastic strip ring between the semiconductor package unit 200 and the wiring board 100, thereby simplifying the manufacturing process, and shortening the manufacturing time and cost.

It is noted that, as long as airflows can be forced to enter the heat exchange space 340 from the second opening 330, the surrounding unit is not necessary to physically contact the three-dimensional contacts 210.

In the embodiment, the semiconductor package unit 200 and the surrounding unit 300 both are in a rectangular shape, i.e., the surrounding unit 300 is formed with four side portions 310, and the semiconductor package unit 200 is formed with four side surfaces 201. Each of the side portions 310 of the surrounding unit 300 is corresponded to one of the side surfaces 201 of the semiconductor package unit 200. The first openings 320 and the second openings 330 are respectively formed on two opposite ones of the side portions 310 of the surrounding unit 300, such that external air can pass through the heat exchange space 340 in a direction from one of the side portions 310 of the surrounding unit 300 to the opposite side portion 310 thereof.

However, the disclosure is not limited thereto, and based on the considerations of the air flow direction or the heat dissipation target, one with ordinary skills in the art may consider forming the first opening 320 and the second opening 330 on two adjacent ones of the side portions 310 of the surrounding unit 300.

Figure 5:
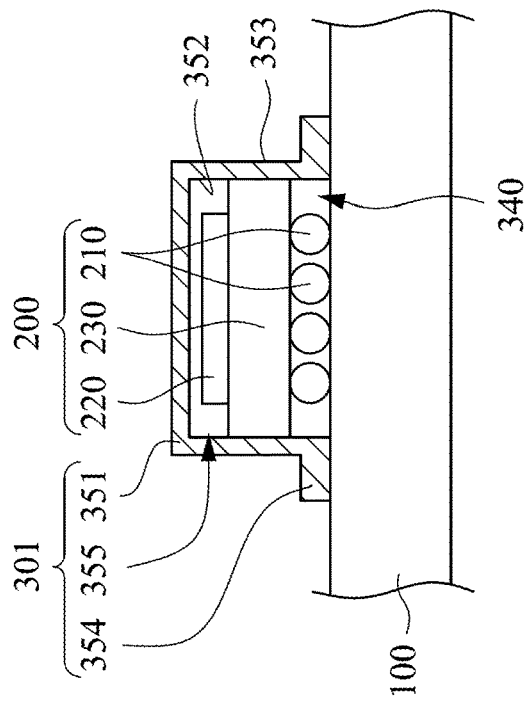
FIG. 5 is a schematic side view of an electronic device according to one embodiment of the disclosure.

FIG. 5 is a schematic side view of an electronic device 11 according to one embodiment of the disclosure. As shown in FIG. 5, the electronic device 11 of FIG. 5 and the electronic device 10 of FIG. 1 are substantially the same, in which the same elements are labeled with the same numerical references in FIG. 5. However, at least one difference between the electronic device 11 of FIG. 5 and the electronic device 10 of FIG. 1 is that, the surrounding unit 301 is disposed on the top surface 101 of the wiring board 100 to contact and completely surround the outer sides of the semiconductor package unit 200, instead of being disposed between the semiconductor package unit 200 and the wiring board 100.

For example, the surrounding unit 301 includes a cover body 351, a flange 354, and an internal space 355. The internal space 355 is formed on the cover body 351, i.e., the surrounding inner sides of the cover body 351 define the internal space 355. The flange 354 protrudes from the outer sides of the cover body 351 to surround the internal space 355. Therefore, when the cover body 351 covers the semiconductor package unit 200 and is placed on the top surface 101 of the wiring board 100, the semiconductor package unit 200 is received in the internal space 355, and the flange 354 is in contact with the top surface 101 of the wiring board 100, such that the surrounding unit 301 can be used as an electromagnetic wave shielding member.

It is noted, although the cover body 351 covers the semiconductor package unit 200, the cover body 351 in the disclosure is not limited to forming a through hole or/and add a heat sink fin or the like at the top surface thereof for heat-dissipation of the semiconductor package unit 200.

Figure 6:
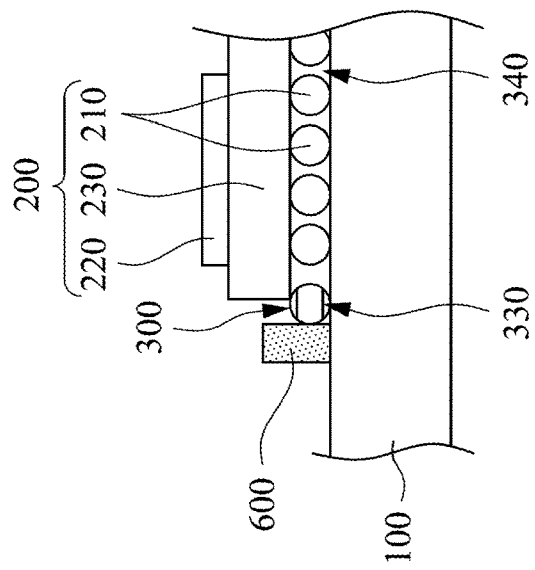
FIG. 6 is a schematic side view of an electronic device according to one embodiment of the disclosure.

FIG. 6 is a schematic side view of an electronic device 12 according to one embodiment of the disclosure. As shown in FIG. 6, the electronic device 12 of FIG. 6 and the electronic device 10 of FIG. 1 are substantially the same, in which the same elements are labeled with the same numerical references in FIG. 6. However, at least one difference between the electronic device 12 of FIG. 6 and the electronic device 10 of FIG. 1 is that, the electronic device 12 further includes a filter element 600 covering the second opening 330 for filtering airflows entering and exiting the heat exchange space 340, such that dust can be prevented from being sucked into the heat exchange space 340 to cause short circuits of the three-dimensional contacts 210. The filter element 600 is, for example, a filter screen or a carbon fiber bundle.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. An electronic device having active heat dissipation, the electronic device comprising:
   a wiring board;
   a semiconductor package unit comprising a plurality of three-dimensional contacts, wherein the semiconductor package unit is soldered to a surface of the wiring board through the three-dimensional contacts;
   a surrounding unit connected to the semiconductor package unit and the wiring board, surrounding the three-dimensional contacts, and comprising a first opening and a second opening, wherein a heat exchange space is collectively defined by the surrounding unit, the surface of the wiring board and the semiconductor package unit;
   at least one fan module located outside the heat exchange space; and
   at least one tube member respectively connected to the first opening and the fan module, thereby allowing the fan module to cool the three-dimensional contacts.

2. The electronic device of claim 1, wherein the fan module comprises:
   an air chamber comprising a buffering space, an opening hole and a fan engagement interface, wherein the buffering space is in communication with the opening hole and the fan engagement interface, and the opening hole is connected to the tube member; and
   a fan unit connected to the fan engagement interface for injecting air flows into the heat exchange space, the air chamber and the tube member.

3. The electronic device of claim 2, wherein the air chamber of the fan module is disposed on the surface of the wiring board, and the fan unit is disposed on one surface of the air chamber opposite to the wiring board.

4. The electronic device having active heat dissipation of claim 2, wherein the tube member comprises a hard tube and a soft hose, and the hard tube is disposed in the soft hose and is connected to the first opening and the opening hole, respectively.

5. The electronic device of claim 1, wherein the surrounding unit is disposed between the semiconductor package unit and the wiring board.

6. The electronic device of claim 1, wherein the surrounding unit is disposed on the surface of the wiring board, and surrounds and physically contacts the semiconductor package unit.

7. The electronic device of claim 1, wherein the surrounding unit is an elastic strip ring tightly surrounding all of the three-dimensional contacts located between the semiconductor package unit and the wiring board, thereby hermetically connecting the semiconductor package unit and the wiring board.

8. The electronic device of claim 1, wherein the first opening and the second opening are respectively formed on two opposite sides or two adjacent sides of the surrounding unit.

9. The electronic device of claim 1, wherein the fan module draws air flows from the heat exchange space through the tube member; or
   the fan module injects air flows into the heat exchange space through the tube member.

10. The electronic device having active heat dissipation of claim 1, further comprising a filter element covering the second opening for filtering airflows entering and exiting the heat exchange space.

* * * * *